(12) United States Patent
Wang et al.

(10) Patent No.: US 6,596,619 B1
(45) Date of Patent: Jul. 22, 2003

(54) METHOD FOR FABRICATING AN UNDER BUMP METALLIZATION STRUCTURE

(75) Inventors: Chung Yu Wang, Jung he (TW); Chender Huang, Hsinchu (TW); Pei-Haw Tsao, Nan chiu (TW); Ken Chen, Hsinchu (TW); Hank Huang, Jungli (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 10/150,831

(22) Filed: May 17, 2002

(51) Int. Cl.$^7$ ............................................. A01L 21/44
(52) U.S. Cl. ...................................... 438/612; 438/613
(58) Field of Search .................................. 438/612, 613

(56) References Cited

U.S. PATENT DOCUMENTS

| | | | |
|---|---|---|---|
| 5,486,282 A | 1/1996 | Datta et al. | 205/123 |
| 5,773,359 A | * 6/1998 | Mitchell et al. | |
| 6,107,180 A | 8/2000 | Munroe et al. | 438/613 |
| 6,130,141 A | 10/2000 | Degani et al. | 438/455 |
| 6,153,503 A | 11/2000 | Lin et al. | 438/613 |
| 6,222,279 B1 | 4/2001 | Mis et al. | 257/779 |
| 6,268,114 B1 | 7/2001 | Wen et al. | 430/314 |
| 6,293,457 B1 | * 9/2001 | Srivastava et al. | |
| 6,332,988 B1 | * 12/2001 | Berger, Jr. et al. | |
| 6,413,878 B1 | * 7/2002 | Woolsey et al. | |
| 6,441,487 B2 | * 8/2002 | Elenius et al. | |
| 6,452,270 B1 | * 9/2002 | Huang | |
| 2001/0005040 A1 | * 6/2001 | Hong | |
| 2001/0008224 A1 | * 7/2001 | Woosley et al. | |
| 2001/0031548 A1 | * 10/2001 | Elenius et al. | |
| 2002/0020855 A1 | * 2/2002 | Hwang | |
| 2002/0056741 A1 | * 5/2002 | Shich et al. | |
| 2002/0096764 A1 | * 7/2002 | Huang | |
| 2002/0127836 A1 | * 9/2002 | Lin et al. | |

* cited by examiner

Primary Examiner—John F. Niebling
Assistant Examiner—Stanetta Isaac
(74) Attorney, Agent, or Firm—George O. Saile; Stephen B. Ackerman

(57) ABSTRACT

An under bump metallurgy (UBM) structure is described. Two UBM mask processes are utilized. First, a top layer of copper (Cu) and/or a middle layer of nickel-vanadium (NiV) or chrome-copper (CrCu) is personalized by standard photoprocessing and etching steps utilizing a bump based size mask. This is followed by patterning an underlying seed layer with a second, larger mask, thereby preventing damage to the aluminum cap and seed layer undercut during the etching process.

11 Claims, 1 Drawing Sheet

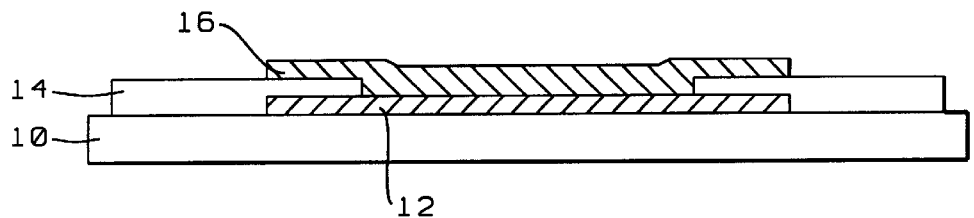
FIG. 1
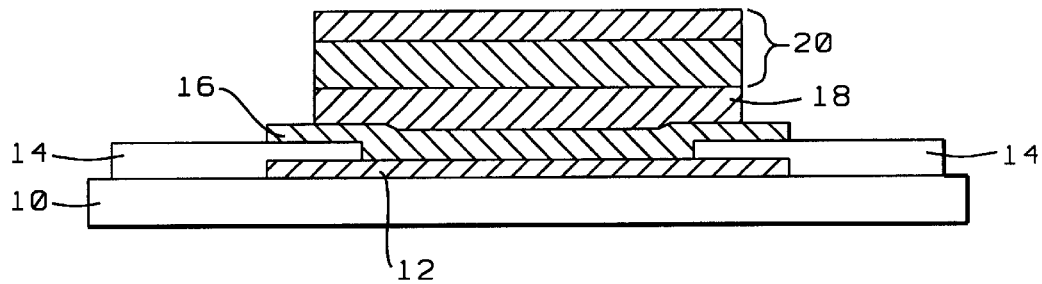
FIG. 2 - Prior Art
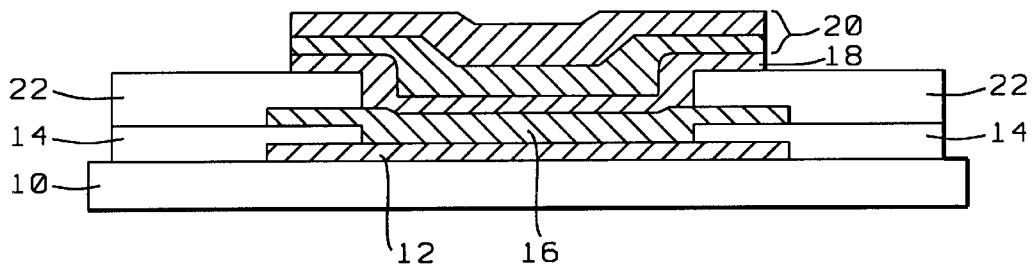
FIG. 3 - Prior Art
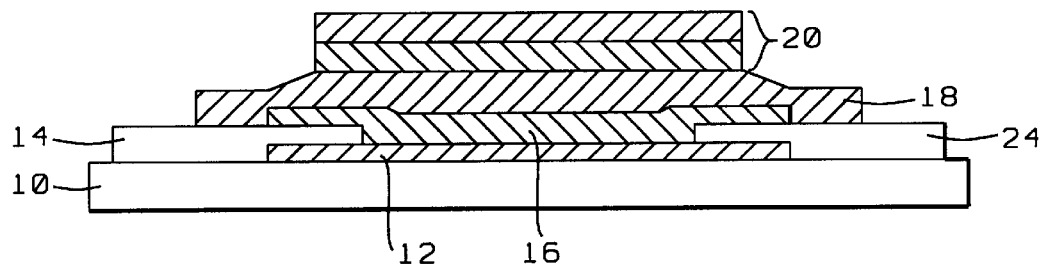
FIG. 4

METHOD FOR FABRICATING AN UNDER BUMP METALLIZATION STRUCTURE

FIELD OF THE INVENTION

The invention relates to microelectronic semiconductor device assembly wafer bumping processes and specifically to the fabrication of a new under bump metallization (UBM) structure.

BACKGROUND OF THE INVENTION

Current and future microelectronic interconnect packaging technologies involve solder bump interconnect bumping on copper wafers. Currently, wafer vendors provide aluminum capping of copper pads in the wafer bumping process, as well as, in wire bonding. Known bumping processes in plating technology will have UBM sputtered and patterned before forming the bump on the I/O pad. The present invention relates to a novel manufacturing process of a new under bump structure (UBM) as related to the manufacture of electronic components.

U.S. Pat. No. 6,268,114 B1 to Wen et al. describes a method for forming fine-pitched solder bumps/balls and devices formed by such method.

U.S. Pat. No. 6,222,279 B1 to Mis et al. describes a method for fabricating solder bumps on a microelectronic device having contact pads including the steps of depositing a titanium barrier layer on the device, forming an under bump metallurgy layer on the titanium barrier layer, and forming one or more solder bumps on the under bump metallurgy layer.

U.S. Pat. No. 6,130,141 to Degani et al. describes techniques for applying under bump metallization for solder bump interconnections on IC chips with A1 bonding sites.

U.S. Pat. No. 6,153,503 to Lin et al. describes a process for producing solder bumps on metal electrodes, of a semiconductor wafer, which involves the formation of the under bump metallurgies on the electrodes.

U.S. Pat. No. 6,107,180 to Munroe et al. describes a method for forming an interconnect bump structure. Under bump metallization structure comprising a chrome layer, a copper layer, and a tin layer is disclosed.

U.S. Pat. No. 5,486,282 to Datta et al. describes a tool and process for electroetching metal films on a substrate employing a linear electrode and a linear jet of electrolyte squirted from the electrode.

SUMMARY OF THE INVENTION

It is therefore an object of the present invention to provide a process for the fabrication of a new UBM structure.

It is another object of invention to provide aluminum cap protection without using silicon nitride (SiN) passivation or benzocyclobutene (BCB), or polyimide (PI) repassivation, to prevent damage or undercut by etching solutions.

In order to accomplish these and other objects of the invention, it has been discovered that two UBM mask processes are utilized in the following manner:

First, a top layer of copper (Cu) is patterned and/or a middle layer of nickel-vanadium (NiV) or chrome-copper (CrCu) is personalized by standard photoprocessing and etching steps utilizing a bump based size mask. This is followed by a patterning seed layer step with a second, larger mask, thereby preventing damage to the aluminum cap and seed layer undercut during the etching process. =

BRIEF DESCRIPTION OF THE DRAWINGS

The foregoing and other objects, aspects and advantages of the present invention will be more clearly understood from the following detailed description taken in conjunction with the accompanying drawings. The drawing illustrate like reference numerals designating similar or corresponding elements, regions and portions and in which:

FIG. 1 is a cross-sectional representation of an initial structure of the invention.

FIGS. 2 and 3 are cross-sectional representations of a Prior Art UBM structure.

FIG. 4 is a cross-sectional representation of a preferred embodiment of the present invention.

DETAILED DESCRIPTION OF THE PREFERRED EMBODIMENT

Problems Discovered by the Inventors

The inventors have discovered the following problems and disadvantages with the current practice:

1. Current bumping processes utilizing plating technologies have the under bump metallization (UBM) sputtered and patterned first, that is, before forming a bump on the I/O pad. During the UBM patterning acid etching process the following yield, function fails, short and long term reliability problems are incurred:
   i) The aluminum cap is damaged
   ii) Gaps result between the under bump metallization and passivation coatings due to different etch rates (undercut) by the UBM etching solution.
2. Polyimide (PI), benzocyclobutene (BCB) or any other organic repassivation coatings of the aluminum cap used in the current practice of the art increases the probability of yield detractors, component failure, and reliability issues due to risks of interfacial delamination after underfill cure.
3. For flip chip C-4 packaging structures the underfill material intended as a stress relaxation coating of the C-4 solder interconnect can instead act as a relaxation film for the PI or BCB repassivation coatings.
4. The increase in process steps (e.g., PI/BCB/SiN) as practiced in the current art increases material and process costs, as well as exposure to reduced yields, and short/long term reliability component issues.

Initial Structure

As illustrated in FIG. 1, structure 10 includes at least one exposed conductive bonding pad 12 preferably through passivation layer 14. Structure 10 is preferably a semiconductor structure and is also understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Bonding pad 12 is preferably comprised of copper or aluminum. Passivation layer 14 is preferably comprised of SiN. Layer 16 cap of bonding pad 12 is preferably comprised of aluminum.

FIG. 2 illustrates a cross-sectional representation of a Prior Art under bump metal (UBM) layer 18/20 formed over aluminum cap layer 16. UBM layer 18/20 is preferably 1000 to 6000 Å thick. UBM layer 18/20 is preferably comprised of sublayer 18 formed of titanium (Ti) or chrome (Cr), and upper metallization layer 20 comprised of NiVor Cr/Cu, Cu.

FIG. 3 shows a cross-sectional view of a Prior Art approach illustrating an organic repassivation layer 22 comprising of polyimide (PI) or benzocyclobutene (BCB) or equivalent high temperature polymer.

FIG. 4 is a cross-sectional view of the preferred structure of the invention. In a key feature of the invention, aluminum cap 16 as shown is protected without requiring passivation layer 14 (SiN) or repassivation layer 22 (e.g., PI or BCB)., Passivation layer 24 is preferably comprised of $Si_3N_4$, $SiO_2$, $Si_3N_4/SiO_2$ and is more preferably comprised of $Si_3N_4/SiO_2$.

Key Steps of the Invention

The process of the invention may be understood with respect to FIGS. 1 and 4. Beginning with the structure of FIG. 1, seed layer 18, comprised of Ti or Cr, is deposited by, for example, sputtering. Subsequently, upper metallization layer 20 comprised of NiVor Cr/Cu, Cu, is also deposited. An initial patterning of top layer 20 is performed, by methods known in the art, using a bump-based size mask, with the resultant width of layer 20 shown in FIG. 4. Subsequently, in a key step of the invention, a second, larger, mask is used to pattern seed layer 18, also as shown in FIG. 4. This second patterning step prevent damage to the aluminum pad 16, and has other advantages as described below.

Advantages of the Present Invention

The advantages of the present invention include:
1. Elimination of the PI/BCB/SiN passivation process steps reduces cost and exposure to yield detractors, such as, interfacial delamination and reliability issues.
2. UBM etching solution damage to aluminum cap and copper pad is prevented.
3. UBM acid etching undercut prevention leads to the formation of a robust UBM structure.

While the present invention has been described and illustrated with respect to preferred embodiments, it is not intended to limit the invention, except as defined by the following claims. Furthermore, numerous modifications, changes, and improvements will occur to those skilled in the art without departing from the spirit and scope of the invention.

What is claimed is:

1. A method of forming a UBM structure, comprising the steps of:

providing a semiconductor substrate, having a passivation layer formed thereover, and a plurality of bond pads exposed through said passivation-layer;

forming an aluminum cap over each of said bond pads;

depositing a seed layer over said substrate;

forming a middle metallization-layer over said seed layer;

forming a top metallization layer over said middle metallization layer;

patterning said top and middle metallization layers, using a bump sized mask; and patterning said seed layer using a mask larger than said bump-sized mask, whereby a portion of said seed layer extends beyond said aluminum cap.

2. The method of claim 1 wherein the conductive metallization layers are comprised of material selected from the group consisting of copper and aluminum.

3. The method of claim 1 wherein the top and middle metallization and seed layers are comprised of a material selected from the group consisting of Ti/Cu, Cr/Cu, Ti/Ni, and Ni/Au.

4. The method of claim 1 wherein the passivation layer is selected from the group consisting of $Si_3N_4$, $SiO_2$, $Si_3N_4/SiO_2$.

5. The method of claim 2 wherein the photoresist layers being comprised of photoresist materials of dry resist film and liquid photoresists.

6. The method of claim 1 wherein said top metallization layer comprises Cu (copper), and said middle metallization layer is selected from the group consisting of nickel vanadium and chrome copper.

7. The method of claim 1 wherein said seed layer is formed of a material selected from the group consisting of titanium and chromium.

8. The method of claim 1 wherein said capped conductive pad comprises a bonding pad.

9. The method of claim 1 wherein said semiconductor substrate comprises a passivation layer, formed over a portion of said bonding pad.

10. The method of claim 1 wherein said bonding pad is capped with an aluminum layer.

11. The method of claim 1 wherein said top and middle metallization and seed layers are selected from the group consisting of Ti/NiV/Cu or Cr/CrCu/Cu.

* * * * *